United States Patent [19]

Paysen et al.

[11] 4,340,855

[45] Jul. 20, 1982

[54] APPARATUS FOR ENABLING CORONA CURRENT MEASUREMENT

[75] Inventors: Kenneth E. Paysen, Longmont; James M. Petrovick, Boulder, both of Colo.

[73] Assignee: International Business Machines Corporation, Armonk, N.Y.

[21] Appl. No.: 159,323

[22] Filed: Jun. 13, 1980

[51] Int. Cl.$^3$ .............................................. G01N 31/02

[52] U.S. Cl. ........................................ 324/72; 428/354

[58] Field of Search ......................... 428/40, 354, 458; 324/72

[56] References Cited

U.S. PATENT DOCUMENTS

| | | | |
|---|---|---|---|
| 2,916,398 | 12/1959 | Marvin | 117/68 |
| 3,160,549 | 12/1964 | Caldwell et al. | 428/354 |
| 3,449,658 | 6/1969 | Robinson et al. | 324/32 |
| 4,156,182 | 5/1979 | Brick | 324/72 |
| 4,189,642 | 2/1980 | Justus et al. | 250/324 |

*Primary Examiner*—Michael J. Tokar

*Attorney, Agent, or Firm*—John H. Holcombe; Francis A. Sirr

[57] ABSTRACT

Precisely positionable apparatus for collecting corona-generated current. A conductive sheet or coating is affixed to one side of an insulative sheet material. A low residue of nonresidue adhesive alone or carried by a tape is affixed to the other side of the insulative sheet. The sheet is then placed on a copier photoconductor or photoconductor carrier such as a drum, adhesive side to the carrier. The adhesive keeps the sheet flat against the surface at which the measurement is to be made. A shock protection line including front-to-back parallel diodes is connected between the conductive surface and ground. With the corona on, and the carrier in position, a current measuring device is connected between the conductive surface on a tab of the sheet and ground.

16 Claims, 6 Drawing Figures

51
60
61
62
63

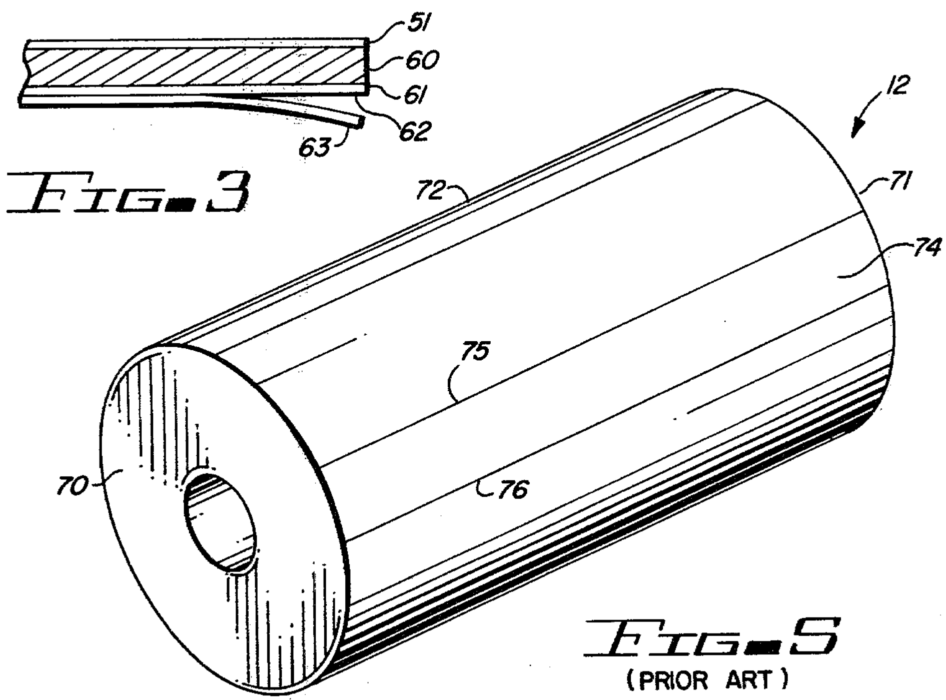
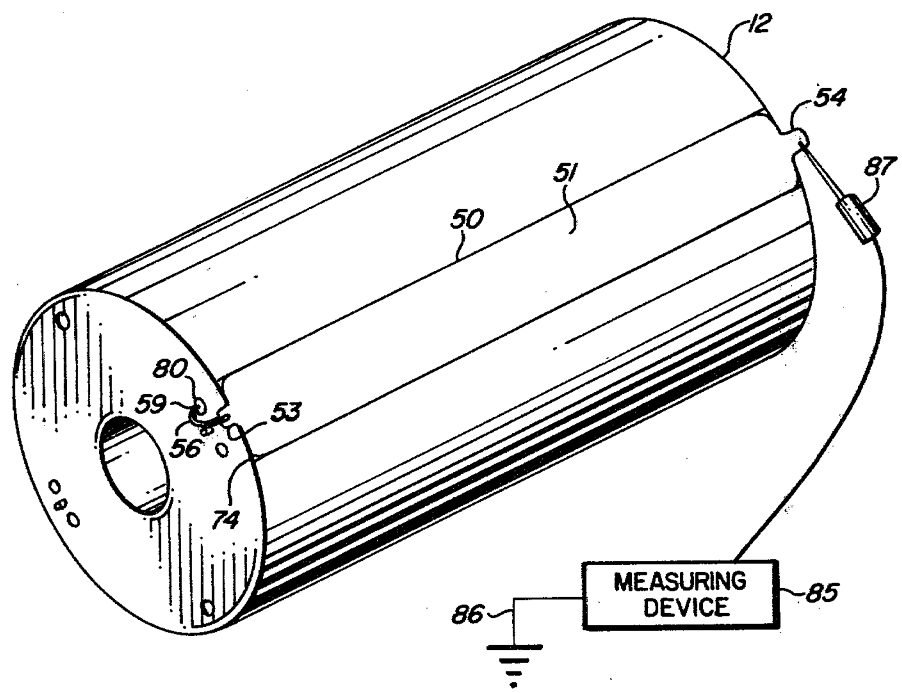
FIG. 6

APPARATUS FOR ENABLING CORONA CURRENT MEASUREMENT

TECHNICAL FIELD

The invention relates to collection apparatus for enabling measurement thereof which is precisely positionable.

As an example, electrophotographic copiers may employ coronas for generating specific charges at the photoconductor. These charges are best measured by measuring the resultant current flow to the photoconductor at the precise position it occupies when in use. The collection and position and the resultant measurement must be precise because small differences in corona charge generation result in major differences in copy quality.

BACKGROUND ART

U.S. Pat. No. 4,189,642 describes an insulated rotatable drum carrying a photoconductor supported on a conductive layer. The conductive support layer is connected via slip rings to ground, and when the circuit is opened, and each corona individually operated, current in the conductive support layer may be measured.

Having a drum of floating voltage, i.e., electrically insulated, would result in irregular charge patterns on the photoconductor except for a sheet of conductive backing for the photoconductor, which must be connected to ground. Further, to provide a measurement of each corona individually, when the conductive backing is adjacent all coronas, a control circuit must be provided to individually activate each corona. A control circuit must also open the ground connection for the conductive backing to allow measurement. The resultant arrangement is therefore very expensive and comprises a permanent part of every machine, whereas the measurement to be made is done only occasionally by or for a repair or maintenance technician.

Another arrangement often used in the assembly of copiers is to remove the normal photoconductor and substitute a special insulated drum with conductive areas for measurement purposes.

Special insulated drums or fixtures for testing are not permanent parts of each machine and are therefore less expensive as concerns total cost. However, they are extremely bulky and cannot be easily or conveniently transported by a repair or maintenance technician. Further, any slight difference in size between the test fixture and the photoconductor carrier, creating a difference between the position of measurement and the actual position of the photoconductor which is to receive a charge, would result in an error.

SUMMARY OF THE INVENTION

A planar sensing element is provided, affixed to and supported by a flexible planar support member and having an adhesive, nonresidue material affixed to the reverse side of the flexible planar support member for holding the support member in position against an element at which sensing is to occur and thereby holding the planar sensing element in precise position across its entire area. A shock protection line and circuit is connected between the planar sensing element and ground. Measurements may be made between the planar sensing element and ground or other selected test points.

The resultant device is truly and easily portable and, when affixed to the element at which sensing occurs, is precisely positioned over its entire area thereby giving a more accurate basis for measurement.

BRIEF DESCRIPTION OF THE DRAWINGS

FIG. 3 is a partial side view of the planar members of the device of the present invention.

FIG. 5 is a perspective view of the drum carrier for the photoconductor of the prior art electrophotographic copier of FIG. 1.

FIG. 6 is a perspective view of the drum of FIG. 5 with the device of the present invention in place.

DETAILED DESCRIPTION OF THE PREFERRED EMBODIMENT

Figure 1:
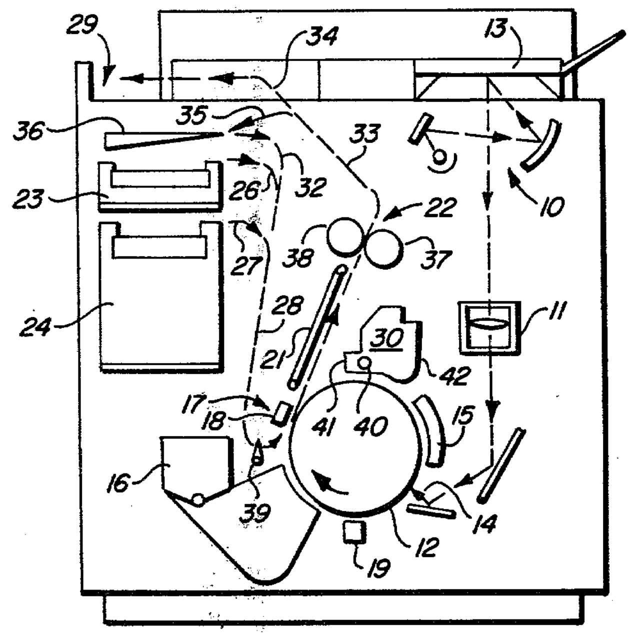
FIG. 1 is a schematic front view of a prior art electrophotographic copier for which the present invention is primarily adapted.

FIG. 1 is a front schematic view of an electrophotographic copier, for example the IBM Series III Copier/-Duplicator. The present invention may be advantageously employed to measure corona currents for this prior art or any similar copier.

In the exemplary copier, a scanning mirror system 10 and a moving lens 11 move in synchronism with the rotation of drum 12, having a photoconductor thereon, to place a latent image of stationary original document 13 onto the photoconductor. The drum and photoconductor are sufficiently large enough so that two operative photoconductor panels are arranged on its circumference, so as to be capable of producing two copies for each drum revolution.

As is well known, prior to imaging at 14, the drum is charged by a corona 15. The corona 15 is a high voltage source designed to place a uniform electrostatic charge on the insulated photoconductor. Once charged, the photoconductor rotates into the image path 14. The portions of the charged photoconductor which are exposed to illumination lose their charge so that the charge remains only in the area of the dark image. Since the entire photoconductor was charged, the area surrounding the working area to image the original document 13 need not retain a charge. Therefore, the photoconductor surrounding this working area is erased by erase station 19.

After imaging, the drum's latent image is developed by magnetic brush developer 16. The magnetic brush carries magnetically attracted particles to which toner, primarily carbon, is coated, past the charged photoconductor. Electrostatic effects cause the toner to adhere to the charged areas, thus providing a visible image on the drum surface. Thereafter, the drum's toned visible image is transferred to a sheet of plain copy paper at transfer station 17 by operation of transfer corona 18. The transfer corona 18 provides the proper charge to the reverse side of the sheet of paper to attract the toner particles on the photoconductor to the paper. The paper, now coated with toner in the image area, is then caused to leave the surface of the drum and to follow sheet movement path 20, adjacent vacuum conveyor 21, to hot roll fuser assembly 22. The fuser 22 causes the toner to melt and adhere to the paper.

Hot roll fuser assembly 22 includes a hot roll 37 and a relatively cool backup roll 38. After fusing, the finished copy sheet follows sheet path 33, 34 and is deposited in output tray 29 when the copier is operating in the sheet simplex mode or side two in the duplex mode. When the copier is operating in the duplex mode, side one, the copy sheet follows sheet path 33, 35, and is deposited in duplex bin 36. Thereafter, when operating in the side two duplex mode, these sheets return to the transfer station while following sheet path 32, 28. These sheets are supplied originally from sheet supply bin 23 and 24, which are arranged to adjustably hold cut sheets of plain paper of different sizes, for example, legal and letter size paper, respectively.

After transfer of the toned image from the photoconductor to the sheet, the photoconductor is cleaned as it passes cleaning station 30. Specifically, inasmuch as all of the toner previously adhering to the drum is not removed by the transfer corona, the cleaning station comprises means for removing the remainder of the toner. Thus, the cleaning station includes a cleaning corona 41, similar to the transfer and charge coronas although opposite in polarities, which serves to remove any remaining charge on the photoconductor, an erase lamp 40 to remove optically residual charge on the photoconductor, and a cleaning brush 42. The cleaning corona 41 ensures that the toner will not adhere to the drum so that the toner is easily removed by the brushing of cleaning brush 42 which rotates in a direction opposite to the rotation of drum 12.

The charge placed on the photoconductor by each of the coronas 15, 18 and 41 must provide clear and complete copying.

Figure 2:
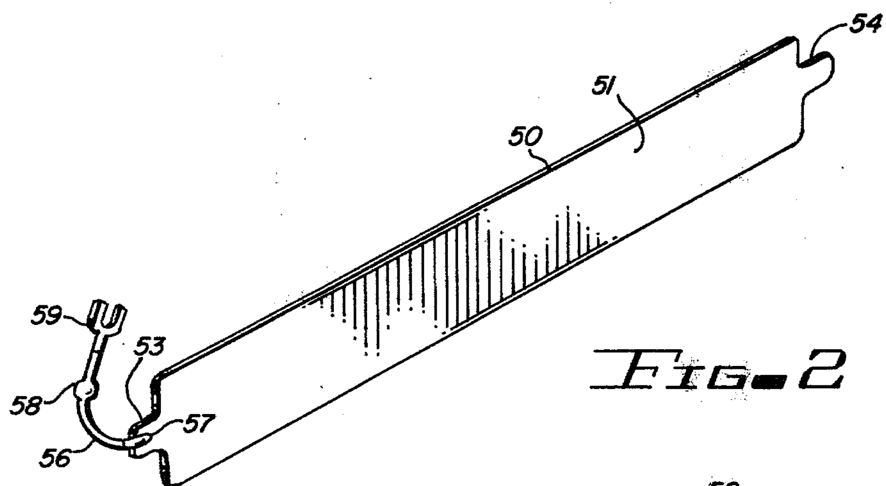
FIG. 2 is a top view of the device of the present invention.

FIG. 2 illustrates the device of the present invention. The device incorporates a planar strip 50 having an electrically conductive surface or sheet 51 thereon. The device is arranged with tabs 53 and 54 at either end. A pigtail or single electrical wire 56 is affixed to tab 53 by any suitable means such as insulated screw 57 so as to be in electrical contact with electrically conductive surface or sheet 51. The electrical connection may be mechanical or soldered. The pigtail also includes diodes 58 and an electrical connector 59.

Referring to FIG. 3, planar sheet 50 comprises electrically conductive coating, layer or sheet 51, which may be aluminum, supported by a support layer or strip 60 which may be a plastic insulating substance such as Mylar. The plastic strip 60 is coated with a sticky substance 61 that leaves minimal or no residue. A removable plastic or paper strip 63 may be provided to protect the surface 62 of the plastic strip 60 from contamination. Preferably, strip 63 is polyethylene. The strip 63 is shown as partially removed.

An example of adhesive element 61 is "high-tack low-tack" tape marketed by the 3M Company under Part No. "Y9415." The strip is approximately three thousanths (0.003) inches thick and surface 62 comprises the low-tack side of the adhesive tape. This low residue or nonresidue surface is defined as "nonresidue" hereinafter. The conductive layer 51 may comprise a sheet of approximately 2½ to 5 ten-thousanths (0.00025 to 0.0005) inch of aluminum. In the specific example, the coating 51 comprises a sheet of aluminum adhered to the "high-tack" side of tape 61. Polyethylene has been selected as the preferred material for strip 63 due to its surface tension characteristic which is low relative to that of the adhesive tape 61.

Figure 4:
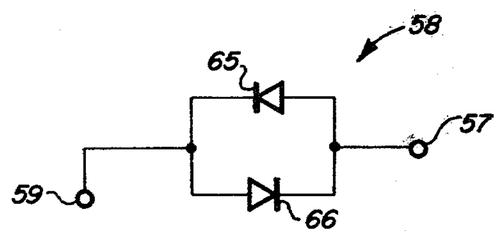
FIG. 4 is a schematic representation of the electrical circuit of pigtail 56 of FIG. 2.

FIG. 4 illustrates schematically the electrical configuration of the diodes 58 in pigtail 56 of FIG. 2. Specifically, diodes 65 and 66 are placed in a front-to-back parallel configuration between connection point 57 and electrical connector 59. This results in a bidirectional low resistance path, the resistance being less than that of the human body so that handling or touching of surface 51 in FIG. 2 will not result in harmful shock. Rather, any excess current resulting from a high voltage build-up would be discharged via diode 65 or 66 to grounded terminal 59. The diodes may be, for example, of the type known as Industry Standard Part. No. 1N914.

FIG. 5 illustrates the photoconductor drum 12 of the copier of FIG. 1. The drum is hollow, having end plates 70 and 71. The photoconductor 72 is wound on reels internal to the drum and is then wrapped about the drum's circumference. A drum seal 74 occupies the space between the point 75 where the photoconductor exits the drum and point 76 where the photoconductor enters the drum.

The strip 50 in FIG. 2 is designed to fit precisely over the drum seal 74 in FIG. 5. When so affixed, the ion current generated by the corona is drawn to conductive surface 51 of strip 50.

FIG. 6 illustrates the device 50 in position on drum 12 of FIG. 5. In FIG. 6, the paper or plastic cover sheet 63 of FIG. 3 has been removed from device 50 and the device placed on drum seal 74 in FIG. 5. The device is thus positioned properly along the entire surface of the drum surface 74. Pigtail 56 on tab 53 of the device is at the end of drum 12 which will be towards the rear of the copier. The device 50 is affixed to the drum when the drum is removed from its working position in the copier. Connector 59 on pigtail 56 is connected to a grounding point on the copier comprising screw 80. The drum 12 is then inserted into the machine and a drum rotated to position the drum seal 74 and, therefore, device 50 immediately adjacent the corona to be tested. Surface 51 of device 50 is thus positioned to collect the ion current generated by the corona being tested. Tab 54 of the device protrudes from the end of drum 12 at the front of the machine, thereby allowing easy access by the repair or maintenace technician.

A measuring device 85 supplied by the repair or maintenance technician includes a grounding lead 86 and a probe 87. The measuring device 85 may comprise any accurate current measuring device, preferably a small portable ammeter. Probe 87, preferably having an alligator clip, is touched to surface 51 on tab 54. Lead 86 is connected to a grounding point on a machine, and the machine, or at least the corona to be tested, is turned on (drum is in a nonrotatable mode during this test). Then, measuring device 85 is observed until a steady state current flow is attained. This current flow is that generated by the corona being tested. Adjustments may then be made to correct any difference between the measured current flow and that desired. These adjustments may take the form of moving the corona closer or further from the drum 12, or adjusting the corona power supply.

Upon completion of the measurement and any appropriate adjustment of the first corona, further coronas may be measured.

The subject device is sufficiently portable and not bulky, so that it may be easily carried by the repair or maintenance technician. However, it is also sufficiently inexpensive that one may be supplied with each copier and stored unobtrusively therein. Further, should its use be required upon installation of new corona parts, a device may be supplied with each such set of parts.

A prime advantage of the device of the subject invention is that it is positioned on the drum actually used by the copier being measured. Thus, there is no size difference, as there might be with a special fixture which is carried by the maintenance or repair technician from machine to machine. The radial position of the measurement is thus precisely controlled to that of the specific machine being measured.

The adhesive nature of the application side of the device 50 ensures that the entire surface of the device is properly and precisely positioned. There is thus no need for a rigid fixture to ensure that no part of the device bends or projects upward from the drum toward the corona. This is important in modern copier technology because the coronas are surrounded by shields which absorb a substantial amount of the corona current. The percentage of the current received by the photoconductor on drum 12 is dependent, therefore, upon the distance of each part of the photoconductor from the corona.

The low residue adhesive makes it possible to use the device on a sensitive surface such as a photoconductor drum without having particles of toner adhering to any remnants of the adhesive. The device, therefore, need not necessarily be employed on the drum seal, but may also be employed on the photoconductor itself. To be absolutely sure that no adhesive or other impurities is left on the surface of the drum seal 74, the surface of the drum seal may be cleaned with a cleaning solution such as alcohol.

While the invention has been particularly shown and described with reference to a preferred embodiment thereof, it will be understood by those skilled in the art that various changes in form and detail may be made therein without departing from the spirit and scope of the invention.

What is claimed is:

1. Apparatus for enabling measurement of corona current which flows to the photoconductor assembly of an electrophotographic device comprising:

an electrically conductive planar collection element to be positioned on the photoconductor assembly adjacent the corona;

electrically insulative planar support means for supporting said planar collection element and coextensive therewith; and an adhesive, nonresidue material affixed to said planar support means on the side opposite said planar collection element, for releasably holding said support means, and thereby said planar collection element, in position on said photoconductor assembly.

2. The device of claim 1 additionally comprising:

a protection circuit connected to said planar collection element having an electrical resistance less than that of the human body.

3. The device of claim 2 wherein said electrical resistance of said protection circuit is bidirectional.

4. The device of claim 2 wherein said protection circuit comprises at least one diode.

5. The device of claim 4 wherein:

said protection circuit comprises two oppositely directed diodes connected in parallel, thereby providing bidirectional protection.

6. A sensing collection device precisely positionable upon the photoconductor assembly for an electrophotographic device in order to enable measurement of corona current to said assembly, comprising:

electrically conductive planar collection means;

electrically insulative planar support means for supporting said planar collection means and coextensive therewith; and adhesive, nonresidue means affixed to said planar support means on the side opposite said planar collection means for holding said planar support means on the photoconductor assembly in a position adjacent a corona.

7. The device of claim 6 wherein:

said adhesive, nonresidue means comprises a material uniformly coated thereon for releasably holding said planar support means flat against the photoconductor assembly.

8. The device of claim 7 additionally comprising:

a protection circuit connected to said planar collection means having an electrical breakdown resistance less than that of the human body but greater than zero.

9. The device of claim 8 wherein:

said planar collection means and said coextensive planar support means both include a coextensive tab extending beyond said surface for completing an electrical circuit to a current measuring device.

10. An electrical current collection device precisely positionable upon the photoconductor assembly of an electrophotographic device, so as to be positionable in current-receiving relation to the corona devices of the electrophotographic device, comprising:

a laminated assembly of an external planar electrically conductive collection means mechanically supported by;

an intermediate electrically nonconductive planar support means and an external adhesive, nonresidue material for releasably holding said laminated assembly on the photoconductor assembly in said current-receiving position; and electrical protection means electrically connected to said electrically conductive collection means.

11. The device of claim 10 wherein:

said electrical protection means is arranged to provide an electrical breakdown resistance less than that of the human body.

12. The device of claim 11 wherein said electrical protection means is bidirectional.

13. The device of claim 11 wherein said electrical protection means comprises at least one diode.

14. The device of claim 12 wherein:

said electrical protection means comprises two oppositely poled diodes connected in parallel between said electrically conductive collection means and an electrical ground of the electrophotographic device.

15. A method of measuring the corona current flow of at least one corona of an electrophotographic device which has a photoconductor assembly adapted to be subjected to current flow from a corona, comprising the ordered steps of:

removably attaching a current collecting assembly, comprising a laminate of an electrically conductive layer and an electrically insulative layer, to said photoconductor assembly by means of a nonresidue adhesive, so as to leave the conductive layer exposed;

moving said photoconductor assembly to a position where said conductive layer is positioned in current-receiving relation to said corona;

energizing said corona from a power supply as said photoconductor assembly remains stationary in said position; and measuring the current which flows between said conductive layer and an electrical potential to which said power supply is referenced.

16. The method of claim 15 including the step of providing a circuit for measuring said current, which circuit provides an electrical breakdown resistance less than that of the human body.

* * * * *